United States Patent
Cefalo et al.

(10) Patent No.: US 11,409,930 B2
(45) Date of Patent: Aug. 9, 2022

(54) SUPPORT SYSTEM AND METHOD

(71) Applicant: RENESAS ELECTRONICS CORPORATION, Tokyo (JP)

(72) Inventors: Agostino Cefalo, Buckinghamshire (GB); Ricardo Vincelli, Duesseldorf (DE)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/760,825

(22) PCT Filed: Jan. 8, 2018

(86) PCT No.: PCT/EP2018/050384
§ 371 (c)(1),
(2) Date: Apr. 30, 2020

(87) PCT Pub. No.: WO2019/134762
PCT Pub. Date: Jul. 11, 2019

(65) Prior Publication Data
US 2021/0216690 A1    Jul. 15, 2021

(51) Int. Cl.
*G06F 30/30* (2020.01)
*G06F 11/00* (2006.01)

(52) U.S. Cl.
CPC ............ *G06F 30/30* (2020.01); *G06F 11/008* (2013.01)

(58) Field of Classification Search
CPC ....... G06F 30/30; G06F 11/008; G06F 11/079
See application file for complete search history.

(56) References Cited

U.S. PATENT DOCUMENTS 5,596,712 A * 1/1997 Tsuyama ............ G06F 11/2257
714/26
9,547,737 B2 * 1/2017 Vincelli ................. G06F 16/20
(Continued)

FOREIGN PATENT DOCUMENTS

EP    2 757 476 A1    7/2014
EP    2 960 837 A1    12/2015

OTHER PUBLICATIONS

Adler Nico et al: "Rapid safety evaluation of hardware architectural designs compliant with ISO 26262", 2013 International Symposium on Rapid System Prototyping (RSP), IEEE, Oct. 3, 2013 (Oct. 3, 2013), pp. 66-72.

(Continued)

*Primary Examiner* — Stacy Whitmore
(74) *Attorney, Agent, or Firm* — McDermott Will & Emery LLP

(57) ABSTRACT

A computer-implemented method of generating functional safety data for a design of an electronic component includes receiving attribute data for elements in an electronic component. The attribute data include element data for the elements, wherein element data for a given element include an identity of the given element and a failure rate characteristic for the given element. The attribute data include functionality data for element functionalities, wherein functionality data for a given element functionality include an identity of a use case, an identity of an element, an identity of a fault characterization for providing information about one or more fault models and a configurable data for controlling selection and use of the given functionality data when generating the functional safety data. The method also includes generating the functional safety data using the attribute data and storing a report including the functional safety data.

12 Claims, 15 Drawing Sheets

(56) References Cited

U.S. PATENT DOCUMENTS

| | | | |
|---|---|---|---|
| 2008/0256383 A1 | 10/2008 | Bose et al. | |
| 2013/0317780 A1* | 11/2013 | Agarwal ............ | G05B 23/0248 |
| | | | 702/181 |
| 2014/0173548 A1* | 6/2014 | Greb .................... | G06F 30/398 |
| | | | 716/136 |
| 2014/0200699 A1* | 7/2014 | Vincelli ................ | G06F 11/008 |
| | | | 700/105 |
| 2017/0147738 A1 | 5/2017 | Saraswat et al. | |

OTHER PUBLICATIONS

International Search Report issued in corresponding International Patent Application No. PCT/EP2018/050384, dated Aug. 21, 2018.
Transmittal of International Preliminary Report on Patentability and Written Opinion of the International Searching Authority for PCT/EP2018/050384, dated Jul. 23, 2020.

* cited by examiner

First use case UCa

| Element | Fault impact | Rationale for FI | Covered by SM | Fault coverage | Rationale for FC |
|---|---|---|---|---|---|
| ADC1 | DVF | In UCa ADC1 is the only conversion element | Double sampling | 60% | Double sampling ensures only limited coverage on the conversion engine |

Second use case UCb

| Element | Fault impact | Rationale for FI | Covered by SM | Fault coverage | Rationale for FC |
|---|---|---|---|---|---|
| ADC1 | IVF | In UCa ADC1 can be considered the SM | SUST | 90% | Start-up Self Test timing falls with the timing constraints a DVF fault s0 it can be considered effective in this case |

Fig. 1

| Element | Functionality | Active | Fault impact | Rationale for FI | Covered by SM | Fault coverage | Rationale for FC |
|---|---|---|---|---|---|---|---|
| ADC1 | UCa | Yes | DVF | In UCa ADC1 is the only conversion element | Double sampling | 60% | Double sampling ensures only limited coverage on the conversion engine |
| ADC1 | UCb | No | IVF | In UCa ADC1 can be considered the SM | SUST | 90% | Start-up Self Test timing falls with the timing constraints a DVF fault s0 it can be considered effective in this case |

| Element | Functionality | Active | Fault impact | Rationale for FI | Covered by SM | Fault coverage | Rationale for FC |
|---|---|---|---|---|---|---|---|
| ADC1 | UCa1 | Yes | DVF | ADC1 is the only conversion element | Double sampling | 60% | Double sampling ensures only limited coverage on the conversion engine |
| ADC1 | UCb1 | No | IVF | Used in conjunction with ADC2 | Redundancy | 99% | Complete HW redundancy is available for this element |
| ADC2 | UCa2 | Yes | NSR | Not used | - | - | - |
| ADC2 | UCb2 | No | IVF | Used in conjunction with ADC1 | Redundancy | 99% | Complete HW redundancy is available for this element |

Fig. 9

| Element | Functionality | Label | Active | Fault impact | Rationale for FI | Covered by SM | Fault coverage | Rationale for FC |
|---|---|---|---|---|---|---|---|---|
| ADC1 | UCa1 | LS1 | Yes | DVF | ADC1 is the only conversion element | Double sampling | 60% | Double sampling ensures only limited coverage on the conversion engine |
| ADC1 | UCb1 | LS2 | No | IVF | Used in conjunction with ADC2 | Redundancy | 99% | Complete HW redundancy is available for this element |
| ADC2 | UCa2 | LS1 | Yes | NSR | Not used | - | - | - |
| ADC2 | UCb2 | LS2 | No | IVF | Used in conjunction with ADC1 | Redundancy | 99% | Complete HW redundancy is available for this element |

Element data

| Element ID | Element Name | Element Description | Element Size | Element FIT Characteristic | Fault Characterisation | Safety-rel. status |
|---|---|---|---|---|---|---|
| ED1 | ADC1 | Analog to Digital Converter instance 1 | 5000 um2 | FIT_Ch_Chip | F_Char_SingleADC | SR |
| ED2 | ADC2 | Analog to Digital Converter instance 2 | 5002 um2 | FIT_Ch_Chip | F_Char_Unused | NSR |

Fault impact data

| Element ID | Fault Impact ID | Fault Model ID | Fault impact |
|---|---|---|---|
| E1 | FI1 | FM1 | DVF |
| E2 | FI2 | FM2 | NSR |

Fault coverage data

| Fault Impact ID | Safety Mechanism ID | Value | Type |
|---|---|---|---|
| FI1 | SM3 | 60 | D |
| FI2 | - | - | - |

Fig. 12

Element data (17 / 130)

| Element ID | Element Name | Element Description | Element Size | Element FIT Characteristic |
|---|---|---|---|---|
| ED1 | ADC1 | Analog to Digital Converter instance 1 | 5000 um2 | FIT_Ch_Chip |
| ED2 | ADC2 | Analog to Digital Converter instance 2 | 5002 um2 | FIT_Ch_Chip |
| 131 | 132 | 133 | 134 | 135 |

Functionality data (50 / 140)

| ELF_ID | Func'ty name | Functionality Description | Element ID | Label |
|---|---|---|---|---|
| F1 | UCa1 | ADC1 is used alone | ED1 | LS1 |
| F2 | UCb1 | ADC1 is used with ADC2 | ED1 | LS2 |
| F3 | UCa2 | It is not used at all | ED2 | LS1 |
| F4 | UCb2 | ADC1 is used with ADC2 | ED2 | LS2 |
| 141 | 142 | 143 | 144 | 145 |

Fault impact analysis data (12 / 150)

| ELF_ID | Fault Model ID | Fault impact | Fault Impact ID |
|---|---|---|---|
| F1 | FM1 | DVF | FI1 |
| F2 | FM6 | IVF | FI2 |
| F3 | FM2 | NSR | FI3 |
| F4 | FM6 | IVF | FI4 |
| 151 | 152 | 153 | 154 |

Fault coverage analysis data (13 / 160)

| Fault Impact ID | Fault Characterisation | Safety Mechanism ID | Value | Type | Safety-rel. status | Active |
|---|---|---|---|---|---|---|
| FI1 | F_Char_SingleADC | SM3 | 60 | D | SR | Yes |
| FI2 | F_Char_DoubleADC | SM15 | 99 | D | SR | No |
| FI3 | F_Char_Unused | - | - | - | NSR | Yes |
| FI4 | F_Char_DoubleADC | SM15 | 99 | D | SR | No |
| 161 | 146 | 162 | 163 | 164 | 147 | 148 |

Fig. 13

| Element | Functionality | FAN | ACT | Fault Impact |
|---|---|---|---|---|
| PINs | PowerSupply | 8 | 4 | DVF |
| | ClockSupply | 4 | 4 | DVF |
| | ADCInputSingle | 10 | 1 | DVF |
| | ADCInputRedundant | 10 | 4 | IVF |
| | ... | ... | ... | ... |
| | NotUsed | 6 | 20 | NSR |

| | Parameter | Label | Active | Value | Unit |
|---|---|---|---|---|---|
| 67 { | Fault_tolerant_time_interval | LS1 | Yes | 0.5 | s |
| | Fault_tolerant_time_interval | LS2 | No | 0.3 | s |
| | Fault_tolerant_time_interval | SG1 | No | 0.3 | s |

66 — 181 — 182 — 68 — 69

SUPPORT SYSTEM AND METHOD

CROSS REFERENCE TO RELATED APPLICATIONS

This application is the U.S. National Phase under 35 U.S.C. § 371 of International Application No. PCT/EP2018/050384, filed on Jan. 8, 2018, the entire contents are hereby incorporated by reference.

FIELD OF THE INVENTION

The present invention relates to a design support system and a method of generating and using functional safety data for an electronic component, such as microcontroller or application specific integrated circuit, electronic system or other electronic apparatus.

BACKGROUND

EP 2 757 476 A1 describes a system for and a method of generating functional safety data, for example in the form of lambda values, for an electronic component, such as a microcontroller (MCU) or application-specific integrated circuit (ASIC). EP 2 757 476 A1 ibid. introduces the concept of fault categories which can be used to indicate whether or not a fault has the potential to violate a safety goal and, if so, whether the fault does so directly or whether it does so only in combination with one or more other faults. This allows fault impact and fault coverage to be considered separately during functional safety analysis, thereby allowing the two types of data to be modified independently of each other. Previously, ISO 26262 fault classes were defined only at the end of a functional analysis process. Thus, the introduction of fault categories allows safety mechanisms to be considered earlier in the process. As a result, a user can modify fault impact data without the need to recalculate fault coverage data and so quickly determine the effect of the modification, for example, by inspecting changes in lambda values, and revise the design of the electronic component.

Although this approach is of great utility and can speed up the process of designing the electronic component, it assumes a single use case. In particular, it assumes that the elements of the electronic component are used in only one way. However, some elements can be used in more than one way, in different use cases. If the user wants to change the way in which an element used, then the user needs to update settings which can be very time consuming and prone to errors.

FIG. 1 illustrates a part of a functional safety analysis report which identifies an element together with corresponding fault impact analysis data, rationale for the fault impact, fault coverage analysis data and rationale for the fault coverage in first and second use cases UCa, UCb. In this example, only one element is listed, namely an analogue-to-digital converter ADC1.

The analogue-to-digital converter ADC1 can be used in two different ways.

In a first use case UCa, the analogue-to-digital converter ADC1 can be used simply as a conversion element. A fault associated with the analogue-to-digital converter ADC1 is categorised as being a direct violation fault (DVF) and which is covered by a safety mechanism in the form of double sampling with 60% coverage.

In a second, different use case UCb, the analogue-to-digital converter ADC1 can be used as a means to double-check accuracy of an external sensor. A fault associated with the analogue-to-digital converter ADC1 is categorised as being an indirect violation fault (IVF) and which is covered by a safety mechanism in the form of start-up self-test (SUST) with 90% coverage.

If a user wishes to switch between these two different use cases, then the user or software tool needs to update several fields, in this example, five fields, for the analogue-to-digital converter ADC1 as well as the corresponding fields for other elements for the same use case.

SUMMARY

According to a first aspect of the present invention there is provided a computer-implemented method. The method comprises receiving attribute data for a plurality of elements (such as CPU cores, digital standard cell blocks and analogue-to-digital converters) comprised in an electronic component, such as a microcontroller, a system-on-a-chip or other monolithic integrated circuit or system which includes a monolithic integrated circuit. The attribute data comprise element data for the plurality of elements, wherein element data for a given element include an identity of the given element and a failure rate characteristic for the given element, and functionality data for a plurality of element functionalities, wherein functionality data for a given element functionality include an identity of a use case, an identity of an element, an identity of a fault characterisation for providing information about one or more fault models and a configurable data for controlling selection and use of the given functionality data and corresponding fault impact analysis data and fault coverage analysis data for the given element when generating the functional safety data. The method comprises generating the functional safety data using the attribute data and storing a report including the functional safety data.

This can make it easier to update settings, as well as help to reduce errors.

The probabilistic metric for random hardware failure is preferably obtained in accordance with ISO 26262 standard.

The configurable data for controlling selection and use of the functionality data when generating the functional safety data may indicate one of two mutually-exclusive states including a first state enabling the function and a second state disabling the given functionality data. For example, the states may be flagged using '0' and '1'.

The configurable data for controlling selection and use of the functionality data when generating the functional safety data may comprises a value which is settable to zero or to a positive non-zero (integer) number, which may be one or greater than one. A value of zero may indicate that the functionality data for the given element is not active whereas a value which is positive and non-zero may indicate that the functionality data for the given element is active.

The functionality data for a given element functionality may further include a label assignable to at least one other element functionality for another different element. Thus, a user can active a given functionality or set of functionalities for several elements simply by activating (or de-activating) a given functionality for one element.

The method may further comprise, in response to receiving a command to set the configurable data for a given functionality data, to set the configurable data for a given functionality data for the at least one other element functionality for the other different element.

The attribute data may further include fault impact data and fault coverage analysis data.

The element data for each element may include an element name. The element data for each element may include an element description. The element data for each element may include information about the area of the element.

The functionality data for each functionality for a given element may include a functionality name. The functionality data for each functionality for a given element may include a functionality description. The functionality data for each functionality for a given element may include fault characterisation data. The functionality data for each functionality may include a safety-related status.

The fault impact analysis data may include a plurality of entries. A fault impact analysis data entry may include data identifying a functionality in the functionality data. An entry may include data identifying a fault model. An entry may include data identifying a fault category (e.g., DVF, IVF or NSR). An entry may include a fault impact identifier used to link the entry to a related fault coverage entry or entries in the fault coverage analysis data.

The fault coverage analysis data may include a plurality of entries. A fault coverage analysis data entry may include a fault impact identifier. A fault coverage analysis data entry may include a safety mechanism identifier. A fault coverage analysis data entry may include data indicating fault coverage. A fault coverage analysis data entry may include data identifying type of fault coverage (e.g., control only (C), detection only (D) or control and detection (CD)).

The electronic system may be an integrated circuit or a plurality of electronic components. For example, the integrated circuit may be a microcontroller. The microcontroller may be a microcontroller configured to be used in a vehicle chassis application. For instance, the microcontroller may include a FlexRay communication controller. The integrated circuit may be an application specific integrated circuit (ASIC). The plurality of electronic components include may include integrated circuit(s), discrete component(s), such as resistors, diodes, etc., MEMS device(s), sensor(s) and/or actuator(s).

The method may comprise preparing a first design of the electronic component, generating functional safety data for the first design of the electronic component and preparing a revised design of the electronic component in dependence upon the functional safety data. Generating the functional safety data may comprise receiving data including configuration data which includes failure rate characteristics identifying a set of failure rates for the element, fault characterisation identifying fault model(s) and/or failure modes(s) and a distribution of each fault model and/or failure modes(s) to the fault characterisation and mapping rules including a plurality of entries, each entry identifying a fault category, safety mechanism coverage class and an ISO 26262 fault class. The fault categories include a direct violation fault (DVF) which can be assigned to a fault which categorises the fault as one which, in the absence of any safety mechanism, has the potential to violate a safety goal directly, an indirect violation fault (IVF) which can be assigned to a fault which categorises the fault as one which, only in combination with one or more other faults, has the potential to violate a safety goal and a no violation fault (NVF) which can be assigned to a fault which categorises the fault as one which, even in combination with one or more other faults, does not have the potential to violate a safety goal. The safety mechanism coverage class indicates whether an assignable safety mechanism is capable of only detecting a fault, of only controlling a fault or of detecting and controlling the fault. The method may comprise receiving fault impact analysis data including a plurality of entries, each entry comprising an element of the electronic component, a fault affecting the element and a fault impact distribution to each fault category. The method may comprise receiving fault coverage analysis data including a plurality of entries, each entry comprising an element of the electronic component, a fault affecting the element, a safety mechanism and a fault coverage distribution to each safety mechanism coverage class. The method may comprise generating functional safety data using the attribute data, the configuration data including the mapping rules, the fault impact analysis data and the fault coverage analysis data, the functional safety data comprising lambda values and/or hardware metric values and/or probabilistic metric for random hardware failure values according to ISO 26262 standard, comprising for a given element, extracting for a given fault, from the fault impact analysis data, fault impact distributions for each fault category, extracting for the given fault, from the fault coverage analysis data, fault coverage distributions for each safety mechanism coverage class, using the mapping rules to identify the ISO 26262 fault class for the given fault; and calculating lambda value(s) representing failure rate(s) for each ISO 26262 fault class of the fault for the given element using the failure rates characteristics and fault characterisation and storing the report including the configuration data, the fault impact analysis data, the fault coverage analysis data and the functional safety data.

According to a second aspect of the present invention there is provided a method of designing an electronic component. The method includes preparing a design of the electronic component, generating functional safety data for the first design of the electronic apparatus, and preparing a revised design of the electronic apparatus in dependence upon the functional safety data.

According to a third aspect of the present invention there is provided a method of fabricating an electronic component. The method comprises designing an electronic component and fabricating the electronic component according to the revised design.

According to a fourth aspect of the present invention there is provided a computer program which, when executed by data processing apparatus, causes the data processing apparatus to perform the method.

According to a fifth aspect of the present invention there is provided a computer program product (which may be non-transitory) comprising a computer-readable medium storing the computer program.

According to a sixth aspect of the present invention there is provided a design support system which includes data processing apparatus comprising at least one processor and at least one memory. The at least one processor is configured to perform the method.

According to a seventh aspect of the present invention there is provided an electronic system fabricated by the method of fabrication.

According to an eighth aspect of the present invention there is provided a motor vehicle comprising the electronic system.

The motor vehicle may be a motorcycle, an automobile (sometimes referred to as a "car"), a minibus, a bus, a truck or lorry. The motor vehicle may be powered by an internal combustion engine and/or one or more electric motors.

According to a ninth aspect of the present invention there is provided a database storing attribute data for a plurality of elements. The attribute data comprises element data for the plurality of elements, wherein element data for a given element include an identity of the given element and a failure rate characteristic for the given element, and functionality data for a plurality of element functionalities, wherein functionality data for a given element functionality include an identity of a use case, an identity of an element, an identity of a fault characterisation for providing information about one or more fault models and a configurable data for controlling selection and use of the given functionality data when generating the functional safety data.

BRIEF DESCRIPTION OF THE DRAWINGS

Certain embodiments of the present invention will now be described, by way of example, with reference to FIGS. 2 to 11b and 13 and 14 of the accompanying drawings, in which:

FIG. 1 schematically illustrates a part of a functional safety analysis report for first and second different use cases;

FIG. 7 schematically illustrates an element having first and second selectable functionalities;

FIG. 8 schematically illustrates two elements, each having first and second selectable functionalities;

FIG. 9 schematically illustrates two elements, each having first and second selectable functionalities, and use of labels for selecting linked functionalities;

FIG. 12 illustrates element data, fault impact data and fault coverage data as used in EP 2 757 476 A1;

FIG. 13 illustrates element data, functionality data, fault impact data and fault coverage data in accordance with the present invention;

FIG. 16 illustrates grouping of functions;

DETAILED DESCRIPTION OF CERTAIN EMBODIMENTS

The present invention is based, at least in part, on the insight that an element, such as an analogue-to-digital converter, in a system, such as microcontroller or application-specific integrated circuit, can perform different functionalities and thus can be assigned different functionalities during functional safety analysis. Herein, the term "use case" can be used instead of "functionality".

By default, an element is assigned a single functionality. However, one or more additional functionalities can be added and the functionality assigned to the element can be selected. This can be done prior to starting safety analysis of the system or during safety analysis. Thus, it is not necessary to know use cases before starting safety analysis or during early stages of safety analysis. If an element is assigned more than one functionality, a user can select which one is to be considered for analysis.

Labels can be used to link functionalities and, if a use case is assigned a label that is shared across more than one functionality, then a user can activate, at once, an entire set of functionalities to be considered for the analysis. As will be explained in more detail hereinafter, a label is shared among different elements. The same label is usually not used for two or more functionalities of the same element, although an exception can be made in certain cases whether there are multiple instances of the same or similar elements, for example, pins of an integrated circuit or multiple communication controllers, such as controller area network (CAN) controllers.

Design Support System 1

Figure 2:
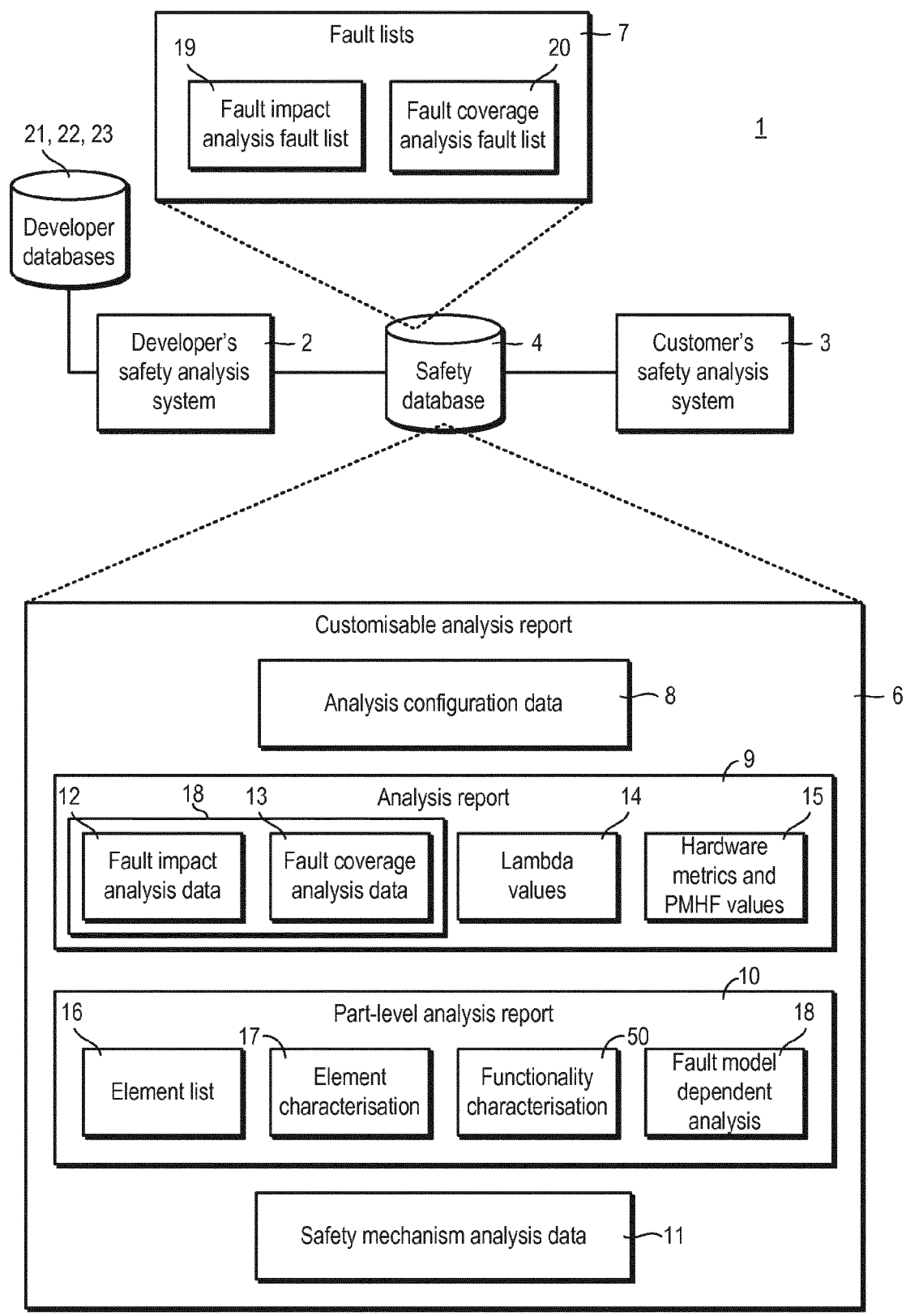
FIG. 2 is a schematic block diagram of a design support system including a safety database which stores a customisable analysis report.

Referring to FIG. 2, a design support system 1 for generating functional safety data for an electronic component, such as a microcontroller, is shown.

The design support system 1 includes a developer safety analysis system 2, a customer safety analysis system 3 and a shared database 4 that stores safety data including a customisable analysis report 6 and fault lists 7 which are used to prepare the customisable analysis report 6.

The customisable analysis report 6 includes analysis configuration data 8, an analysis report 9, a part-level analysis report m and a safety mechanism report 11. The analysis report 9 includes fault impact analysis data 12, fault coverage analysis data 13, lambda values 14 and hardware metric values and probabilistic metric for random hardware failure (PMHF) values 15. Reference is made to ISO 26262 which is incorporated herein by reference. The part-level analysis report 10 includes a list of elements 16, element characterisation data 17 and fault dependent analysis 18. The fault dependent analysis 18 comprises fault impact analysis data 12 and fault coverage analysis data 13.

The fault lists 7 include a fault impact analysis fault list 19 and a fault coverage analysis fault list 20. The customisable analysis report 6 and/or fault lists 7 may be stored in the forms of a set of tables.

The fault impact analysis data 12 and fault coverage analysis data 13 need not be included in the analysis report 9. Likewise, the fault impact analysis data 12 and fault coverage analysis data 13 need not be included in the part-level analysis report 10.

The fault impact analysis data 12 and fault coverage analysis data 13 can be stored to separately from the analysis report 9 and/or part-level analysis report 10. The fault impact analysis data 12 and fault coverage analysis data 13 can be duplicated (e.g., by mirroring) and stored in one of or both the analysis report 9 and/or part-level analysis report 10.

The design support system 1 also includes a set of developer databases 21, 22, 23.

A developer can generate the customisable analysis report 6 when designing an electronic component, such as a microcontroller. The developer and/or the customer may change the analysis configuration data 8, fault impact analysis data 12 and fault coverage 13 and inspect the effect of doing so on the lambda values 14 and hardware metric values and PMHF values 15.

Some parts of the customisable analysis report 6 may be visible to the developer, but not the customer. Some parts of the customisable analysis report 6 may be visible, but not changeable by the customer. Some parts of the customisable analysis report 6 may be changeable by the customer, but the customer may be limited to making changes to values lying in ranges or having specific values specified by the developer. Limiting the customisable analysis report 6 in one or more of these ways can help to prevent the customer from making unexpected or invalid changes.

The design support system 1 may take the form of a database and a database management system. The customisable analysis report 6 may be stored in the form of spreadsheets and text files.

Figure 3:
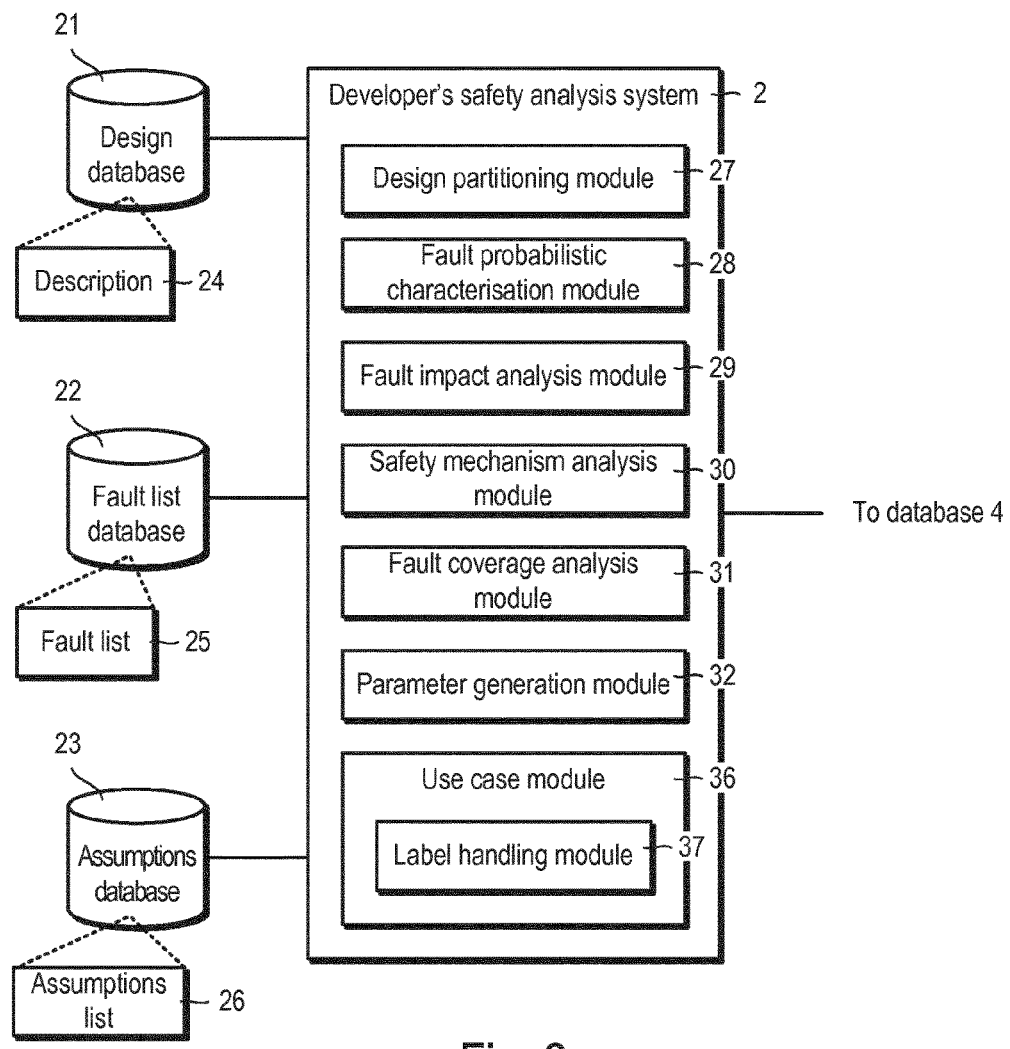
FIG. 3 is a schematic block diagram of a developer safety analysis system.

FIG. 3 illustrates the developer side of the design support system 1 in more detail.

Referring to FIG. 3, the design support system 1 includes a set of developer databases 21, 22, 23 including a design database 21, a fault list database 22 and an assumptions database 23. The design database 21 stores a description 24 of a design of an electronic component, for example in the form of a pre-layout, gate level net list which includes size information. However, the description 24 may include additional information about layout, such as distance between logic blocks. Layout information may be used to identify, for example, bridge faults. The description 24 may include information at a higher or lower level of abstraction. The description 24 may include information from more than one level of abstraction.

The fault list database 22 stores a list of possible faults 25. The fault list 25 may take the form of a table, for example in a spreadsheet or text file, listing possible faults, such as "stuck at 0" or "stuck at 1".

The assumptions database 23 stores assumptions 26 about how the electronic component will be used. The assumptions 26 may take the form of a table, for example a spreadsheet or text file, listing assumptions, such as "Assumption 1: System is using an external watchdog that will generate a reset if not cleared every to milliseconds".

The developer safety analysis system 2 includes modules 27, 27, 29, 30, 30, 32 for generating the customisable analysis report 6. The developer safety analysis system 2 includes a design partitioning module 27, a fault probabilistic characterisation module 28, a fault impact analysis module 29, a safety mechanism analysis module 30, a fault coverage analysis module 31, a safety parameter generation module 32, a use case module 36 and a label handling module 37.

Figure 4:
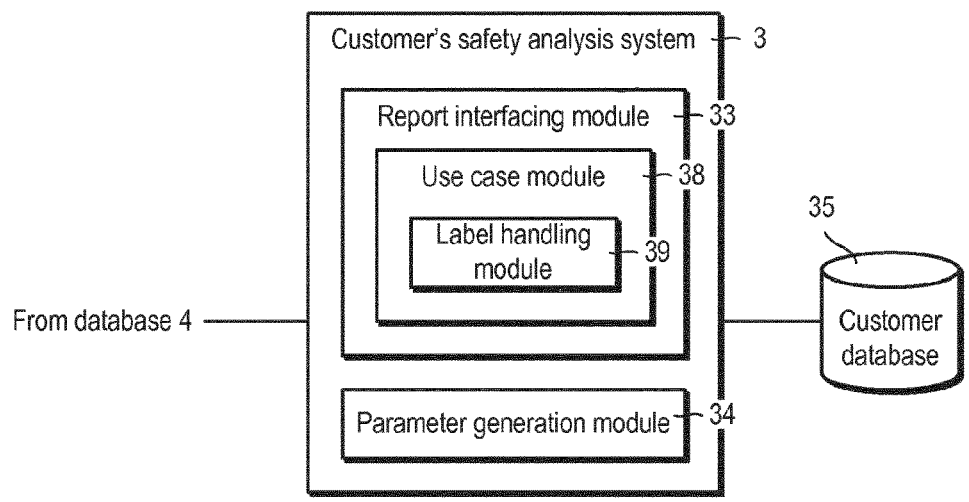
FIG. 4 is a schematic block diagram of a customer safety analysis system.
Figure 5:
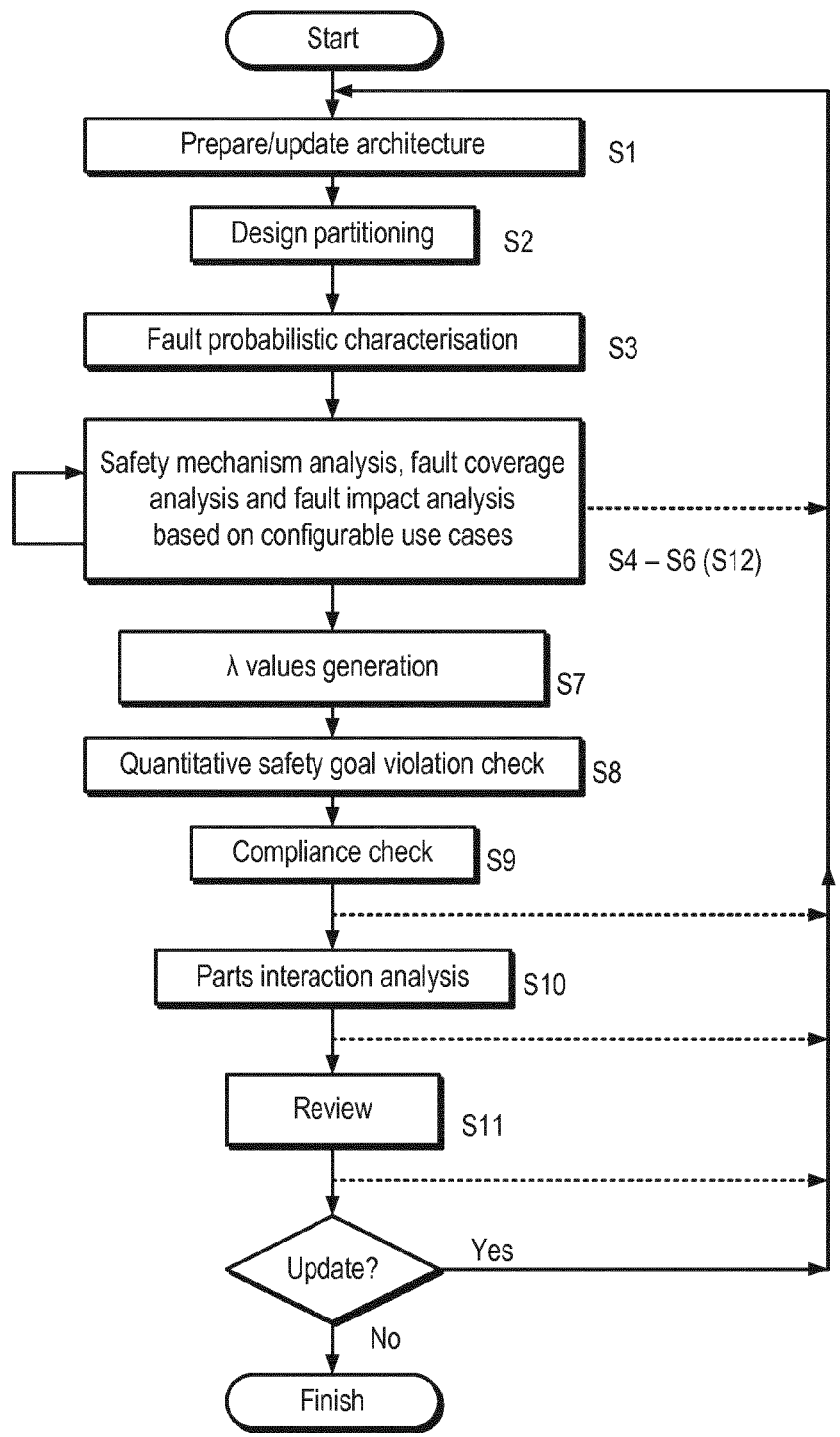
FIG. 5 is a design support process flow diagram.

FIG. 4 illustrates the customer side of the design support system 1 in more detail.

Referring to FIG. 4, the customer safety analysis system 3 includes a report interfacing module 33 and, optionally, a parameter generation module 34. The customer safety analysis system 3 may accesses customer databases(s) 35. The customer safety analysis system 3 may include one or more modules 27, 28, 29, 30, 31, 32 which are the same or similar to those of the developer safety analysis system 2. In some examples, the customer safety analysis system 3 may mirror the developer safety analysis system 2 and so include the same modules 27, 28, 29, 30, 31, 32 for generating the customisable analysis report 6. The report interfacing module 33 includes a use case module 38 and a label handling module 39

The developer safety analysis system 2 may be implemented in a distributed system comprising a plurality of networked computer systems (not shown).

The design support system 1 allows a developer and customer to collaborate during development of an electronic component. Using the system 1 and the processes described herein, a systematic approach can be followed to quantify the safety capabilities of an electronic component and assess its development. The design support system 1 can speed up process of designing the electronic component.

Further details of the system can be found in EP 2 757 476 A1 which is incorporated herein by reference.

Overview of Safety Analysis

Referring to FIGS. 2, 3, 4 and 5, an overall approach to analysing functional safety capabilities of an electronic component is shown. Herein, the example of a microcontroller will be used. However, the approach may be applied to other types of integrated circuits such as system-on-a-chip (SoC), memory, application-specific integrated circuit (ASIC), analogue IC, mixed signal IC and power IC, as well as other electronic components. The approach may be applied to electronic systems which comprise a plurality of electronic components.

A design (not shown) for an electronic component, in this example a microcontroller, is prepared (step S1).

The design (not shown) is partitioned to define elements (not shown) which include parts (not shown), such as CPU cores, embedded memory and communication units, and sub-parts (not shown), such as macros and digital standard cell blocks (step S2).

Once the elements (not shown) have been identified, physical defects with the potential to affect each element (not shown) are identified and each element (not shown) is characterised by allocating a failure rate, measured in units of failures in time (FIT) (which is the number of failures expected per 109 device-hours of operation), to the element (not shown), by assigning one or more fault models to the element (not shown) and, if there is more than one fault model, by assigning a distribution of a failure rate between the different fault models (step S3).

Safety mechanisms, such as self-checking logic or loop back logic, embedded in the microcontroller or which are assumed to be outside the microcontroller, are identified and their properties are investigated (step S4). As will be explained in more detail later, a safety mechanism can be implemented fully in hardware, fully in software or using both hardware and software, or be provided outside the microcontroller. Once the safety mechanisms have been identified, the overall effectiveness of safety mechanisms is determined (step S5).

Independent of any consideration of safety mechanisms, the impact of faults on elements (not shown) is determined (step S6). Assumptions about the usage of the microcontroller can be made.

Once fault coverage and fault impact have been evaluated, fault classification is undertaken which yields failure rates and hardware metrics for the microcontroller (step S7). As will be explained in more detail later, the use case module 36 (FIG. 3) extracts, among other things, fault coverage analysis data and fault impact analysis data according to use case and passes the fault coverage analysis data, fault impact analysis data and other data to the parameter generation module 36 to generate lambda values 14 and hardware metrics 15.

The results 14, 15 are output in a report 6 and stored in the safety database 4. The report 6 is customisable. The developer and/or customer can change input parameters to see how the results 14, 15 change.

Probability of safety goal violations due to random hardware failures can be evaluated (step S8). As explained earlier, values of PMHF can be obtained using FMEA-like analysis.

A check can be made of results compliance against quantitative targets (step S9). This includes checking hardware metrics values and probabilistic metric for random hardware failure (PMHF)/cut-set methods against defined targets to check for plausibility and compliance. Interaction between on-chip modules can be analysed (step S10).

A review of the safety analysis, hardware metric values and PMHF/cut-set results is made (step S11). The design may be updated (step S12) and the process repeated until a satisfactory design is realized.

Further details of the system can be found in EP 2 757 476 A1 which is incorporated herein by reference.

Multiple Functionalities

Figure 6:
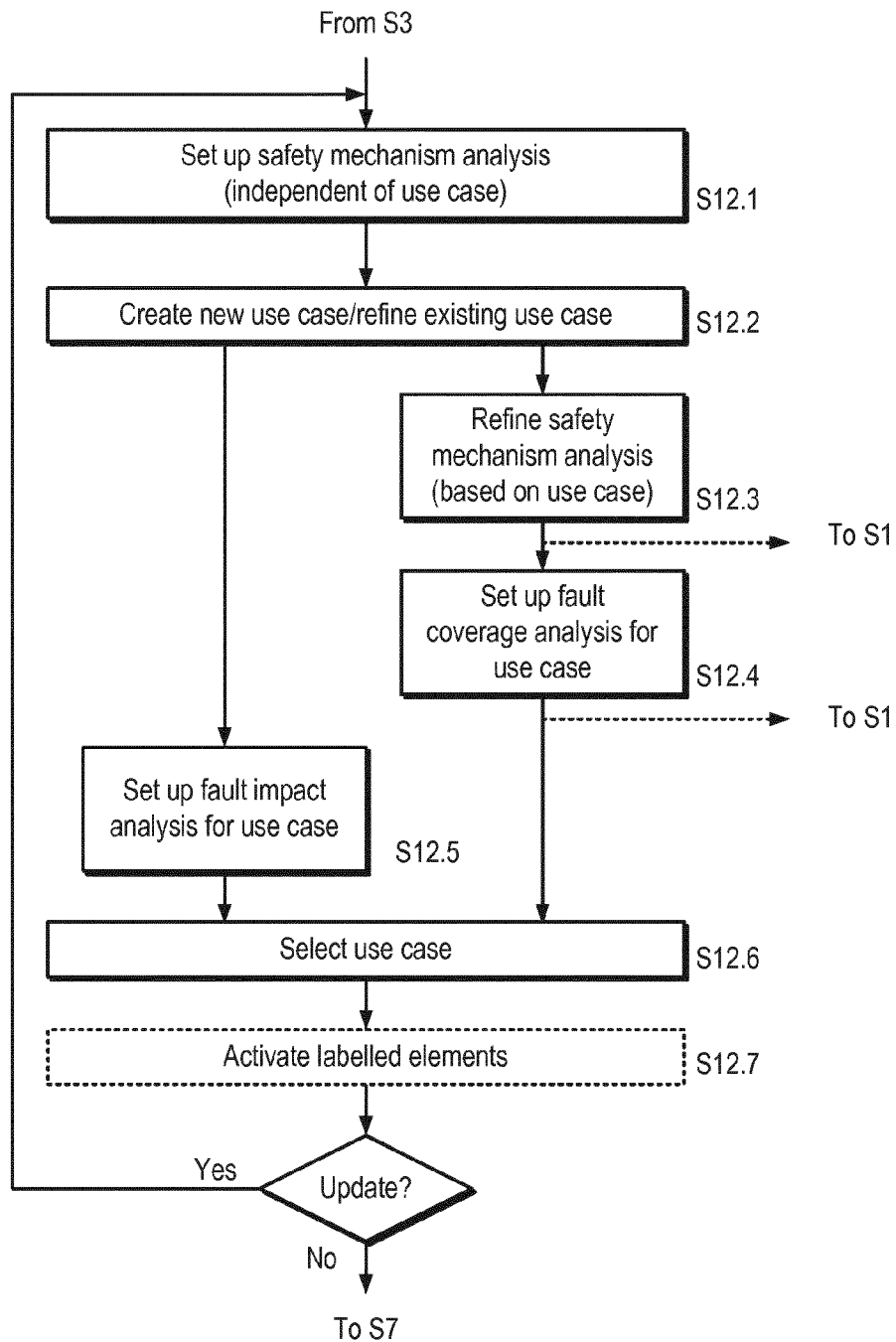
FIG. 6 illustrates setting up and use of configurable use cases.

Referring also to FIG. 6, steps S4 to S6 (collectively labelled as step S12) are adapted to handle multiple use cases.

Safety mechanism analysis (which is independent of use case) is set up (step S12.1). A safety mechanism analysis report 11 (FIG. 12) identifies safety mechanisms, the description of the working principles of the safety mechanism, class of cover provided by the safety mechanism (for example, detection only ("D"), control only ("C") or detection and control ("CD")) and relevant timing.

New use cases can be created and/or existing use cases can be refined (step S12.2).

Based on use case, safety mechanism analysis data can be refined (step S12.3) and fault coverage analysis is created (step S12.4). Independently, based on use case, fault impact for use case is created (step S12.5).

The user can then select a use case (step S12.6). As will be explained in more detail later, this can be controlled using a user-selectable flag which activates or de-activates a given functionality. If labelling is used, then the system 2, 3 (herein referred to as the "tool") can automatically switch functionalities for an entire set of elements in response to the user selecting a use case for just one element (step S12.6).

Referring to FIG. 7, a part $9_1$ of the analysis report 9 for a single element is shown.

The analysis report $9_1$ includes one or more entries identifying an element, which in this case is a first analogue-to-digital converter ADC1. For a given element, one or more entries $40_{1a}$, $40_{1b}$ are defined for each use case. Each entry $40_{1a}$, $40_{1b}$ can include information identifying the element, for example a name 41, information identifying the functionality, for example a name 42, a field 44 for selecting the use case, and fault impact field 45, rationale for the fault impact field 46, safety mechanism field 47, fault coverage field 48 and rationale for the fault coverage field 49.

The user can switch between first and second use cases UCa, UCb by simply selecting one of the use cases using the use case selecting field 44. The tool 2, 3 can automatically toggle the other use case selecting field(s) 44 for the other use cases. For example, if the user selects "Yes" in the use case selecting field 44 for the first use case UCa, then the tool 2, 3 can switch the use case selecting field 44 for the second use case UCb to "No". Based on which use case is active (or "enabled"), the appropriate safety mechanism analysis data, fault coverage analysis data and fault impact analysis data is used.

Referring to FIG. 8, a part $9_1$ of the analysis report 9 for two elements is shown.

Here, the elements include a first analogue-to-digital converter ADC1 and a second analogue-to-digital converter ADC2. For each element, two different functionalities are selectable.

Labelling

Referring to FIG. 9, since a use case can involve a combination of different elements, to help to be able switch functionalities in an easy and consistent way, a label field 43 may be provided.

Labels allow grouping of functionalities assigned to different elements. By default, no label is assigned. However, if needed, a user can add one or more labels to link functionalities. This can be done at any point (i.e., before the start of the analysis process is conducted or during the analysis process). If a use case is assigned a label that is shared across more functionalities, then the user can active, at once, the entire set of functionalities to be considered for analysis.

Figure 10A:
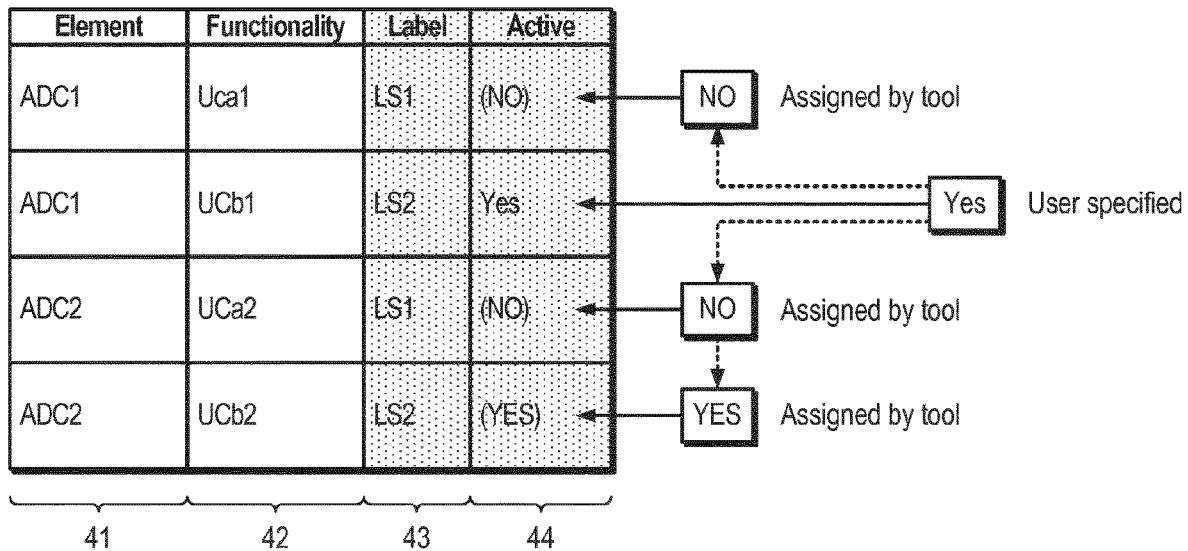
FIGS. 10a and 10b illustrate first and second ways of activating a first use case.
Figure 10B:
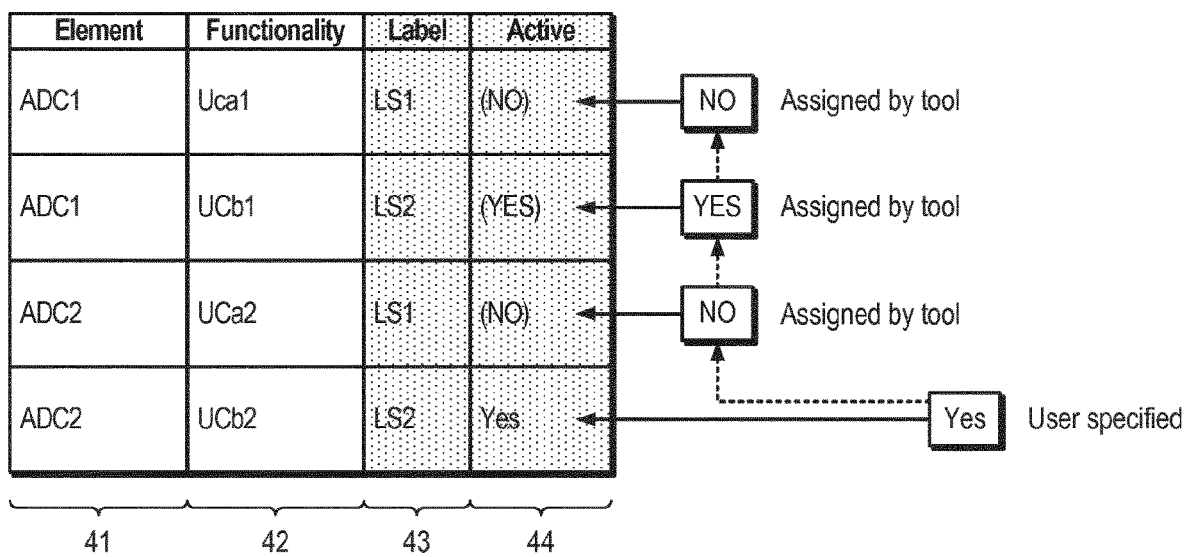

Referring to FIGS. 10a and 10b, a given use case can be selected and activated for elements sharing the same label, in this case LS1 and LS2, by selecting (or deselecting) the given use case for one of the members of the set.

For example, if the user selects to activate the second use case UCb for the first analogue-to-digital converter ADC1, then the tool automatically activates the second use case UCb for the second analogue-to-digital converter ADC2, and de-activates the other use cases, in this example, the first use case UCa for the first and second analogue-to-digital converters ADC1, ADC2.

Conversely, if the user selects to activate the second use case UCb for the second analogue-to-digital converter ADC2, then the tool automatically activates the second use case UCb for the first analogue-to-digital converter ADC1, and de-activates the other use cases, in this example, the first use case UCa for the first and second analogue-to-digital converters ADC1, ADC2.

Figure 11A:
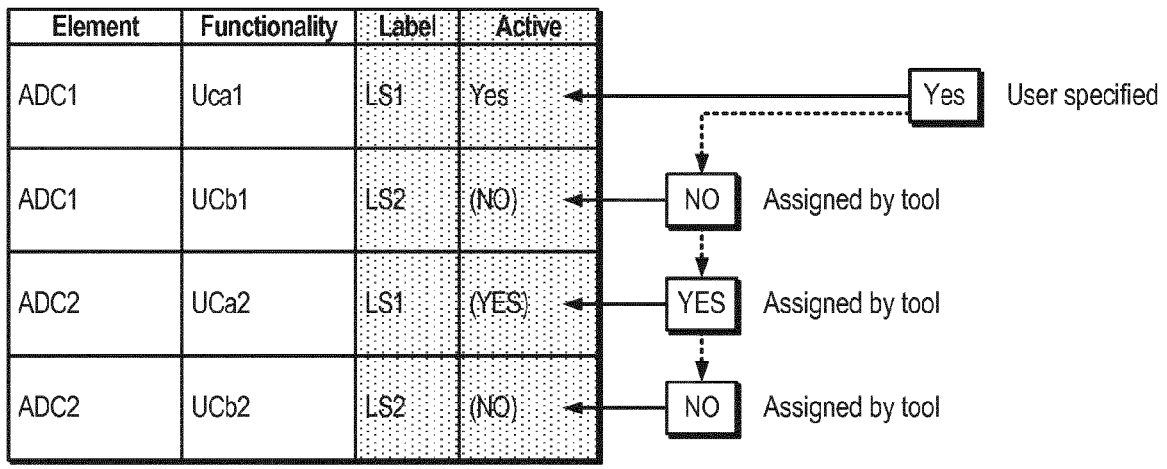
FIGS. 11a and 11b illustrate first and second ways of activating a second use case.
Figure 11B:
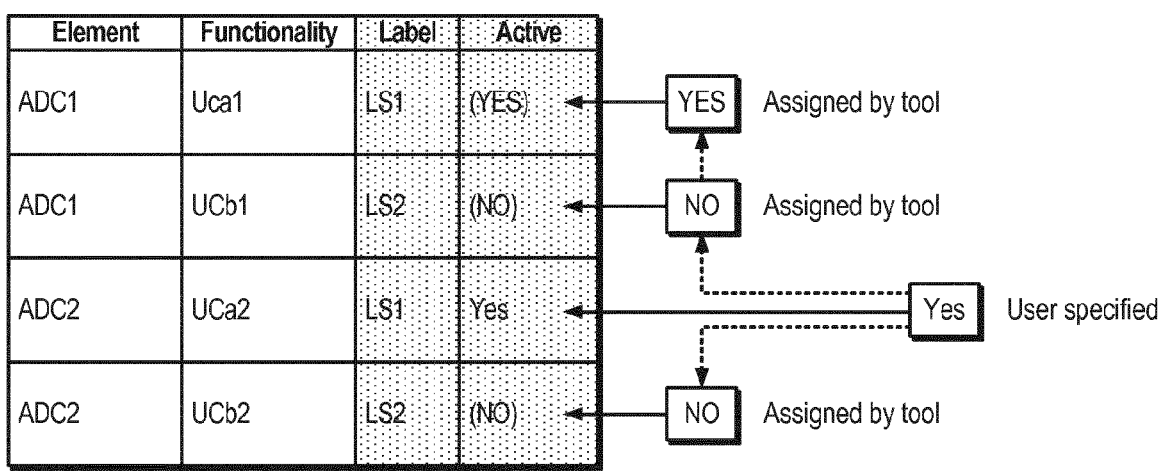

Referring to FIGS. 11a and 11b, if the user selects to activate the first use case UCa for the first analogue-to-digital converter ADC1 or the second analogue-to-digital converter ADC1, then the tool automatically activates the first use case UCa for the other analogue-to-digital converter, and de-activates the other use cases.

As will be explained later, labelling can also be used to select between different sets of configuration data.

Attribute Data

Referring to FIG. 12, to help provide a better understanding of the customisable analysis report 6 (FIG. 1), element data, fault impact data and fault coverage analysis data as used in EP 2 757 476 A1 in shown.

The element data (referred to as "element characterisation data") includes a plurality of entries, each including a data identifying an element, for example using an element identifier, element name and element description, and corresponding information relating to the element, such as element size, element failure in time (FIT) characteristic data, fault characterisation data and safety-related status. The element FIT characteristic data and fault characterisation data may include profiles which are defined in configuration data.

The fault impact data includes a plurality of entries, each entry including a field containing data identifying an element, for example using the element identifier, a field containing data identifying a fault impact, a field containing data identifying a fault model and a field containing data identifying a fault category (e.g., DVF, IVF or NSR).

The fault coverage data includes a plurality of entries, each entry including a field containing data identifying a fault impact, a field containing data identifying a safety mechanism, a field containing data indicating fault coverage and a field containing data identifying type of fault coverage (e.g., control only (C), detection only (D) or control and detection (CD)).

Referring also to FIG. 13, element data 17, functionality data 50, fault impact data 12 and fault coverage analysis data 13 are shown. Whereas previously attributes belonged to elements, attributes are now spit between elements and functionalities.

The element data 17 includes a plurality of entries 130. Each entry 130 corresponds to an element, such as an analogue-to-digital converter. Each entry 130 includes a field 131 for an element identifier, a field 132 for an element name and a field 133 for element description. Each entry 130 also includes a field 134 for holding the information about the area of the element, which may be used to calculate the failure rate using a failure rate per unit area and also a field 135 for the element FIT characteristic data.

The functionality data 50 includes a plurality of entries 140. Each entry 140 corresponds to a functionality. Each entry 140 includes a field 141 for a functionality identifier, a field 142 for a functionality name and a field 143 for a functionality description. Each entry 140 also includes a field 144 for identifying a corresponding element, a field 145 for a label 145, a field 146 for fault characterisation data, a field 147 for safety-related status and a field 148 for indicating whether the functionality is active.

The fault impact data 12 includes a plurality of entries iso. Each entry 150 corresponds to a respective functionality. Each entry 150 includes a field 141 identifying a fault model 152, a field 153 identifying a fault category (e.g., DVF, IVF or NSR) and a field 154 for a fault impact identifier used to link the entry 150 to related fault coverage entry or entries 160 in the fault coverage analysis data 13.

The fault coverage analysis data 13 includes a plurality of entries 160. Each entry 160 corresponds to a fault impact. Each entry 160 includes a field 161 for a fault impact identifier, a field 162 for a safety mechanism identifier, a field 163 containing data indicating fault coverage and a field 164 containing data identifying type of fault coverage (e.g., control only (C), detection only (D) or control and detection CD).

Figure 14:
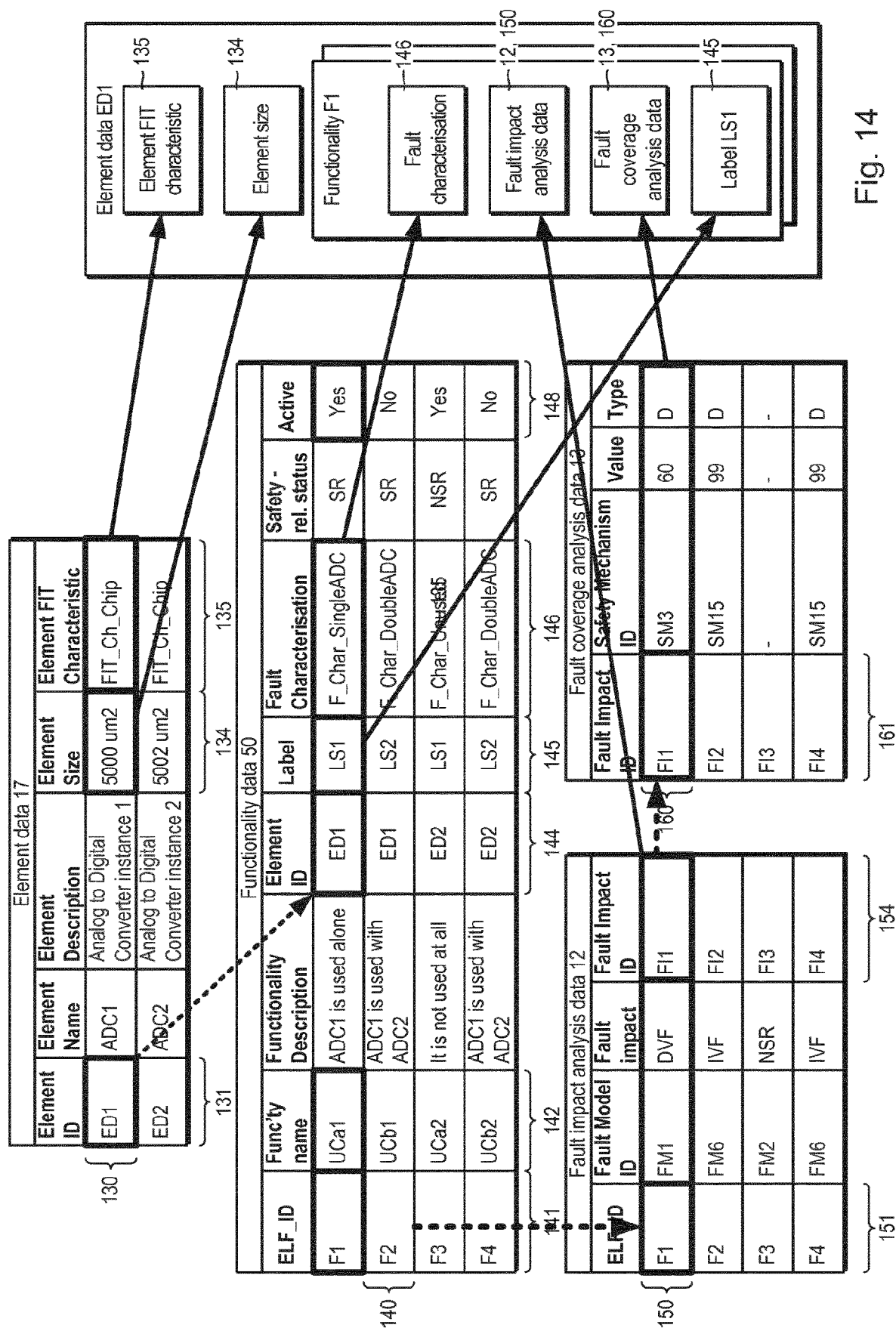
FIG. 14 illustrates links within and between element data, functionality data, fault impact data and fault coverage data shown in FIG. 13.

Referring to FIG. 14, for a given element (for example, in this case ED1) there is an element identifier 131 which is used to identify one or more entries 140 in the functionality data 50. For a given use case 142 having a corresponding label 145, one of the one or more entries 140 is selected based on the activate field 148, for which there is a functionality identifier 140 (for example, in this case F2) which is used to identify a given set 150 of fault impact data 12 relating to the element. This in turn includes a fault impact identifier 154 which is used to identify a given set 160 of fault coverage analysis data 13 relating to the element. Thus, a set of element data 130 can be seen as including one or more sets of functionality data 50 each including a respective set of fault impact analysis data 12 and fault coverage data 13.

Figure 15:
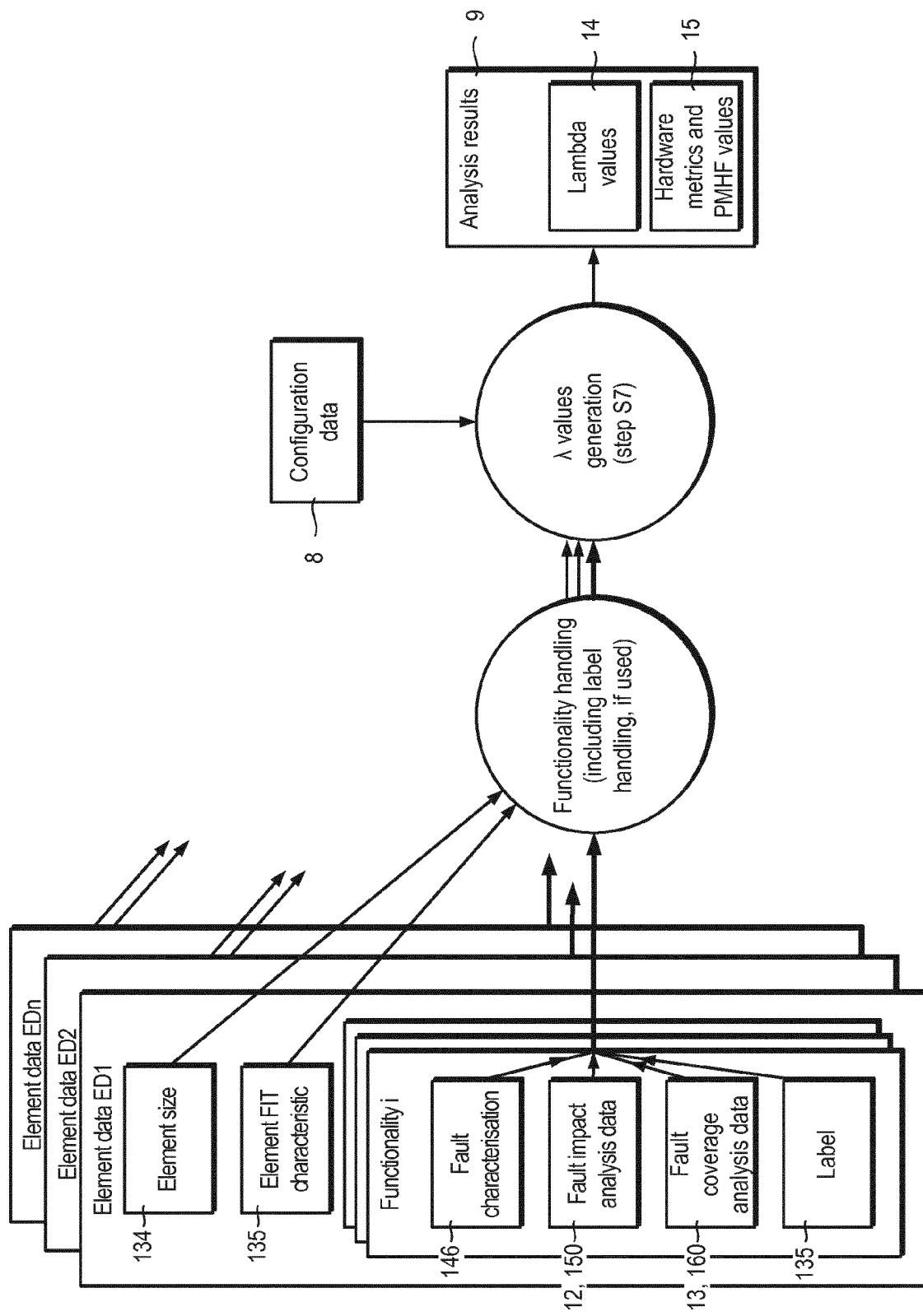
FIG. 15 illustrates a lambda values generation process.

Referring also to FIG. 15, by selecting a particular use case which is active, a given element functionality can be selected and used for generating functional safety data 14, 15. FIG. 15 shows data for only one selected functionality of one element passing to the lambda generation process. It will be appreciated that data for other selected functions for other elements will also pass to the lambda generation process.

Label Format

When an element functionality "f" is being activated for a hardware element "e" and Ee_FUNf_LABEL is not unique, then the tool activates all element functionalities for which Ei_FUNj_LABEL=Ee_FUNf_LABEL assigning Ei_FUNj_ACT=Ei_FUNj_FAN and, at the same time, unlabelled functionalities related to these elements and any active functionalities labelled with a different label are de-activated.

When an element functionality "f" is being de-activated for a hardware element "e" and Ee_FUNf_LABEL is not unique, then the tool activates for each hardware element "x" having one element functionality "y" for which Ex_FUNy_LABEL=Ee_FUNf_LABEL assigning Ex_FUNi_ACT=Ex_FUNi_PREACT for all element functionality belonging to element "x".

Ee_FUNi_PREACT is assigned by the tool to each functionality of a hardware element with the following criteria, namely a) 0 by default, or b) Ee_FUNi_ACT every time an unlabelled functionality is activated.

Referring still to FIG. 13, Ee_FUNf_LABEL corresponds to label 145.

Referring also to FIG. 16, Ei_FUNj_ACT corresponds to a field 171 for a numerical value of active functionalities. If the field 171 is set to '0', then the functionality is inactive.

An additional field, Ei_FUNj_FAN corresponding to field 170 for a multiplicity factor (or "Fan-out" or simply "FAN") can be used to allow the entry to be a group of elements.

Multiplicity is primarily used for pins (not shown) of a microcontroller or other monolithic integrated circuit (not shown).

In a microcontroller there may be several pins related to, for instance, a "power supply" function. Assume, for example, there are eight of these pins. Without a multiplicity factor field, the user would need to provide eight entries, one for each power supply pin. Using a multiplicity factor field, only one entry is needed to which is assigned a multiplicity factor of eight.

The user can specify a multiplicity factor they chose. The user can also split up a group of elements into two or more groups of sub elements to aid analysis. For example, he or she might split a group of eight power supply pins into two groups, for example, one consisting of three entries and another containing five entries.

Referring still to FIG. 14, an additional field, Ee_FUNi_PREACT corresponding to field (not shown) for a buffer (or "PREACT") can be used to allow for automatic block-activation of unlabelled functionalities. This stores a value of "active" when unlabelled functionalities are activated.

FIG. 16 illustrates use of the multiplicity factor 170 and active 171.

Assume that the total number of pins for an MCU is N, where N=100 and that there are $n_1$ power supply pins, where $n_1$=8, are $n_2$ clock supply pins, where $n_2$=4, and $n_3$ ADC input pins, where $n_3$=10. Accordingly, FAN is equal to 8, 4 and 10 for the functionalities power supply, clock supply and ADC input respectively.

ACT can take a value up to FAN. The sum of ACT of the functionalities associated with the entry PIN should equal the total number of pins, i.e. N, which is 100.

This example takes into account the possible use cases for the analogue-to-digital converters. Depending on how the analogue-to-digital converters are used, analysis of the pins can change. Thus, there can be two different functionalities for the ADC pins. There will always be ten pins dedicated to ADC inputs and so both entries have FAN=10.

If multiplicity is used, then the functionality data 50 would be modified by replacing the field 148 (which could simply be a one-bit flag) with a field 171 capable of storing a number greater than one (for example, up to 127) and by adding a field 170 for storing FAN. As mentioned earlier, the ACT field 171 can take a value of 0 indicating that the functionality is not active or a value of 1 or more, indicating that the functionality is active.

Use of Labelling in Configuration Data

As explained earlier, labels can be used to select a set of functionalities for several elements at once and so allow a user to choose between different use cases more easily.

Labels can also be used in a similar way to choose between different sets of configuration data 8, such as parameter analysis section configuration data $8_3$. Further details regarding configuration data can be found in EP 2 757 476 A1 ibid.

Figures 17, 18:
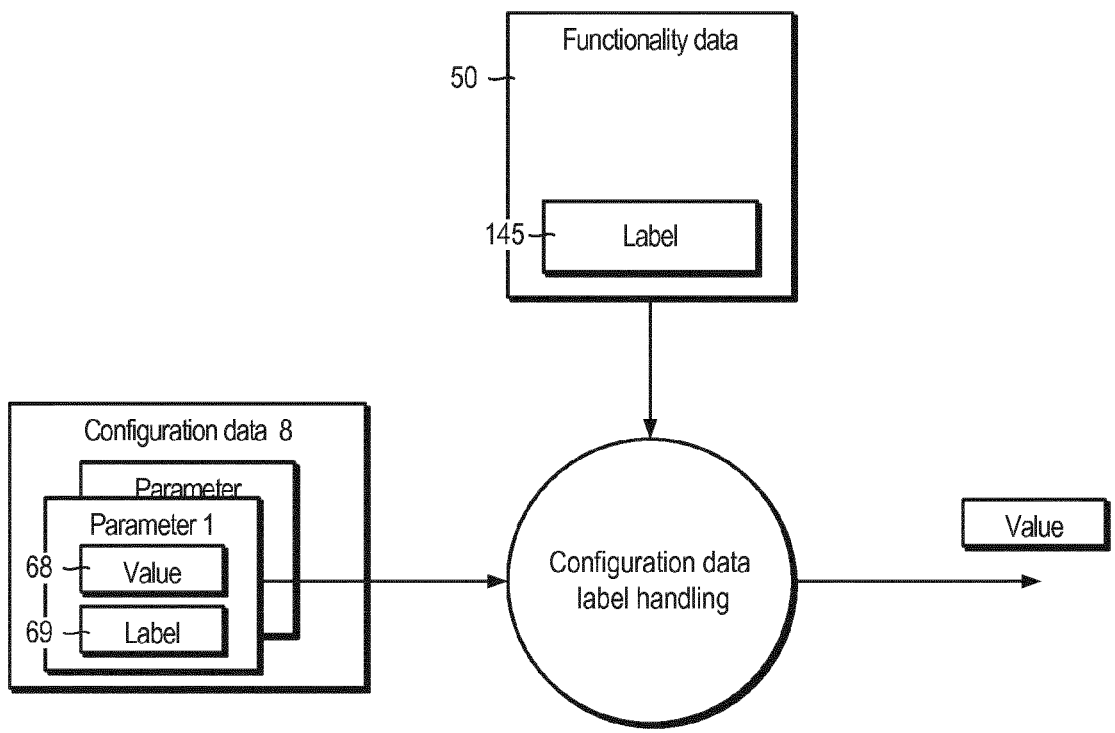
FIG. 17 is a schematic diagram of a portion of configuration data.
FIG. 18 illustrates selection of configuration data using labels.

Referring to FIG. 17, a given parameter, such as fault tolerant time interval may include more than one entry 67 each having a respective value and unit 68, 69. Each entry 68 also includes a field 181 for storing a label and a field 182 for indicating whether the data is active or not.

Referring also to FIG. 18, a configuration data label handling process can be used to extract and pass activated configuration data.

The label may correspond to label 145 found in functionality data 50. Thus, selecting a given use case can cause a given value in configuration data 8 to be selected. However, the label may not have a counterpart label in functionality data. Thus, in this case, a given value in configuration data 8 may be selected using the active field 182.

Modifications

It will be appreciated that various modifications may be made to the embodiments hereinbefore described.

The design support system can be used to design other types of integrated circuits, such as application-specific integrated circuits. The design support system can be used to design other forms of electronic component. The design support system can be used to design electronic, optoelectronic and other data processing apparatus.

The invention claimed is:

1. A computer-implemented method comprising:
   receiving attribute data for a plurality of elements comprised in an electronic component, the attribute data comprising:
      element data for the plurality of elements, wherein element data for a given element include an identity of the given element and a failure rate characteristic for the given element; and
      functionality data for a plurality of element functionalities, wherein an element of the plurality of elements is assigned two or more functionalities, wherein functionality data for a given element functionality include an identity of a use case, an identity of an element, an identity of a fault characterisation for providing information about one or more fault models and a configurable data for controlling selection and use of the given functionality data and corresponding fault impact analysis data and fault coverage analysis data for given element when generating functional safety data;
   generating the functional safety data using the attribute data; and
   storing a report including the functional safety data.

2. The method of claim 1, wherein the configurable data for controlling selection and use of the functionality data when generating the functional safety data indicates one of two mutually-exclusive states including a first state enabling the function and a second state disabling the given functionality data.

3. The method of claim 2, wherein the configurable data for controlling selection and use of the functionality data when generating the functional safety data comprises a flag settable to indicate the first state and the second state.

4. The method of claim 1, wherein the configurable data for controlling selection and use of the functionality data when generating the functional safety data comprises value which is settable to zero or to a positive non-zero number.

5. The method of claim 1, wherein the functionality data for a given element functionality includes a label assignable to at least one other element functionality for another different element.

6. The method of claim 5, further comprising:
   in response to receiving a command to set the configurable data for a given functionality data, setting the configurable data for a given functionality data for the at least one other element functionality for the other different element.

7. The method of claim 1, wherein the electronic component is a microcontroller or application specific integrated circuit.

8. A method of designing an electronic component, the method including:
   preparing a design of the electronic component;
   generating functional safety data by the method of claim 1 for a first design of the electronic component; and
   preparing a revised design of the electronic component in dependence upon the functional safety data.

9. A method of fabricating an electronic component, the method comprising:
   designing an electronic component of claim 8; and
   fabricating an electronic component according to the revised design.

10. An electronic component fabricated by the method of claim 9.

11. A computer program product comprising a computer-readable medium storing or carrying thereon a computer program which, when executed by data processing apparatus, causes the data processing apparatus to perform the method of claim 1.

12. A design support system comprising:
   a data processing apparatus comprising:
      at least one processor; and
      memory,
   wherein the least one processor is configured to perform the method of claim 1.

* * * * *